United States Patent

Konewko et al.

[15] 3,697,929

[45] Oct. 10, 1972

[54] CONTROLLED INSERTION FORCE RECEPTACLE FOR FLAT CIRCUIT BEARING ELEMENTS

[72] Inventors: Joseph E. Konewko, Hillside; Carl Occhipinti, Melrose Park, both of Ill.

[73] Assignee: The Bunker-Ramo Corporation, Oak Brook, Ill.

[22] Filed: Jan. 18, 1971

[21] Appl. No.: 107,103

[52] U.S. Cl. ........................339/75 MP, 339/176 MP

[51] Int. Cl. .............................................H01r 13/54

[58] Field of Search...................339/74, 75, 176, 274

[56] References Cited

UNITED STATES PATENTS

| | | | |
|---|---|---|---|
| 3,475,717 | 10/1969 | Lane | 339/176 MP |
| 3,569,905 | 3/1971 | Kehagioglow | 339/75 MP |
| 3,329,926 | 7/1967 | Aksu et al. | 339/176 MP |

*Primary Examiner*—Joseph H. McGlynn
*Attorney*—Frederick M. Arbuckle

[57] ABSTRACT

A receptacle which applies a small controlled force, for example zero force, to flat circuit bearing elements during element insertion and withdrawal. The receptacle includes a frame having an element receiving slot. A slide is positioned in the frame under the slot and is raised by rotating a cam shaft. The slide has projecting fingers which engage the ends of contact fingers to move a point midway along each contact finger further into the element receiving slot thus causing the contact finger to apply increased pressure to an element position in the slot.

6 Claims, 2 Drawing Figures

INVENTOR.
CARL OCCHIPINTI
JOSEPH KONEWKO
BY
Ronald J. Kransdorf

CONTROLLED INSERTION FORCE RECEPTACLE FOR FLAT CIRCUIT BEARING ELEMENTS

This invention relates to receptacles for flat circuit bearing elements, such as printed circuit boards or thick film and then film substrates, and more particularly to a receptacle for these elements which exerts a controlled force on an element being inserted into and withdrawn from the receptacle.

With the miniaturization of electronic circuits, many circuits are now either printed, deposited or otherwise formed on either or both surfaces of a board or similar substrate. In use, these boards are fitted into suitable receptacles which receptacles are then interconnected and connected to other circuit elements to form complex electronic devices. In order to permit electrical contact with the receptacle, a plurality of contact points are provided along at least one edge of the printed circuit board. These contact points generally are in the form of strips of conductive material to which circuitry on the board may be connected.

Standard receptacles used heretofore with printed circuit boards utilize contact members which are mechanically biased to engage the board and its terminal strips (contact points) with a predetermined force. This force, exerted over a circuit area, assures good electrical contact with the board when the board is in the receptacle. However, with increased miniaturization requiring smaller contact areas, the amount of pressure required to assure good contact has correspondingly increased. However, while this relatively high force is desirable when the board is in the receptacle, it can cause problems when the board is being inserted into or removed from the receptacle.

One problem stems from the fact that a substantial amount of circuitry appears on each printed circuit board thus requiring the use of a large number of contact points. It is not unusual for a circuit board to have from 50 to several hundred contact points. The combined force of this many contact points may make insertion and removal of a board difficult or even impossible without special equipment. Therefore, with standard receptacles, the contact pressure, and possibly the number of contact points on the board, must be restricted in order to permit easy insertion and removal of the board.

Another problem with existing receptacles is that the contacts rub under high pressure against the terminal strips of the printed circuit board during insertion and removal. Since the terminal strips of a typical board are only a few thousandth of an inch thick, this rubbing of the contacts against the terminal strips during insertion and removal of the boards tends to wear away the terminal strips and may well ruin a circuit board after several insertions and removals. The high friction between the boards and the receptacle contacts may also wear away precious metal on the contact surface or otherwise damage the contacts. This tends to reduce the useful life of the receptacle. Contact and terminal strip wear resulting from insertion and removal of boards with standard receptacles thus necessitates replacement of expensive elements and may well lead to difficult-to-detect failures in the electronic equipment utilizing the boards. Another related problem occurs when the element being utilized is a ceramic substrate such as is used with thin film and thick film circuits. These substrates are relatively fragile and may be chipped, cracked or broken in attempting to force them between the contacts of a standard receptacle.

It would therefore appear that a receptacle is required which exerts zero force on the circuit board contacts during board insertion and removal, and in many applications this is in fact a requirement. However, with time, a thin film tends to form on contact fingers and points which tends to reduce conductivity. This film can be penetrated or removed if there is a low controlled pressure wipe between the elements during board insertions and removals.

It is, therefore, a primary object of this invention to provide an improved receptacle for flat circuit bearing elements such as printed circuit boards and film substrates.

A more specific object of this invention is to provide a receptacle for thin circuit bearing elements which receptacle has contacts which apply a controlled force to the element during insertion and removal which force may, in some applications, be zero.

Some attempt has been made in the past to design receptacles for printed circuit boards and the like which exert zero force on the board during insertion and removal. One such receptacle is shown in copending application Ser. No. 846,496 entitled "Zero Insertion Force Receptacle for Flat Circuit Bearing Elements " filed July 31,1969, on behalf of V. Palecek et al. and assigned to the assignee of the instant application. While this receptacle is excellent for many applications, there are at least three problems in its design, two of which are related, which limits its use in some applications. First, the cam shaft which is rotated to spread the contact fingers is in contact with the fingers and thus cannot be constructed of a conducting material. Since insulating materials of comparable price do not have the torque bearing capacity of conductive material such as metals, the non-conducting shaft must be made thicker in order to be able to stand the required torque. The use of a thicker shaft increases the overall size of the receptacle and imposes a limitation or receptacle miniaturization efforts.

A second problem is that the cam shaft is positioned below the point of contact between the receptacle contact fingers and the circuit board. Some distance must also be provided between the point at which the cam shaft contacts the fingers and point at which the fingers emerge from the supporting block. The result is that the contact fingers are relatively long. This means that there is a relatively long electrical path through the fingers which increases circuit resistance and decreases circuit operating speed. This receptacle is thus not suitable for applications where a short circuit path is essential. The relatively short distance between the cantilever point and the point at which force is applied to the fingers in this prior art receptacle also substantially increases the amount of force which is required to move the fingers. From standard lever equations, it is apparent that the force required to move the fingers could be substantially reduced if the point at which force is applied could be moved further up on the fingers.

Other prior art devices for solving the zero insertion force problem have been relatively complex, bulky, expensive and heavy. The cost of these devices has been further increased by fine tolerances required in order to achieve satisfactory operation. Another problem with many of these devices is that they positively drive all contact fingers against the board with a single drive element. Independent movement of the fingers is thus prevented. Since slight variations in board thickness or board warpage may cause non-uniform initial spacing between the boards and the contacts, such a drive scheme may result in excessive pressure on some contacts and too little pressure on others. Excessive pressure may damage the contact or the terminal strip coating, or, in the case of ceramic board, the board itself. Too little pressure may result in poor electrical contact intermittent errors in the equipment utilizing the board.

A more specific object of this invention is therefore to provide an improved controlled or zero insertion and removal force receptacle for flat circuit bearing elements.

Another object of this invention is to provide a receptacle of the type indicated above which permits the use of conductive material, such as metals, for torque bearing members.

A further object of this invention is to provide a receptacle of the type indicated above which provides a short electrical path through the contact fingers.

A still further object of the invention is to provide a receptacle of the type indicated above which minimizes the force necessary to move the contact fingers by providing a relatively long distance between the cantilever point of a contact finger and the point at which force is applied to the finger.

Another object of this invention is to provide a receptacle of the type indicated above which is relatively simple, light, and inexpensive, not requiring fine tolerances in manufacture.

Still another object of this invention is to provide a receptacle of the type indicated above in which the size of the various elements may be easily modified within a broad range so as to be suitable for various applications.

Still another object of this invention is to provide a receptacle of the type indicated above which causes a uniform pressure to be applied to the circuit board terminal strips in spite of slight variations in board thickness or board warpage.

In accordance with these objects this invention provides a receptacle for flat circuit bearing elements having contact points along at least one edge thereof. The receptacle includes a frame assembly of an insulating material having a slot therein which is adapted to receive the edge of the element having the contact points. At least one contact is mounted in the frame. The contact is angled toward the slot to a first point midway along its length and away from the slot for the remainder of its length. The first point is normally positioned relative to the slot so as to be adapted to apply a controlled pressure to an element positioned in the slot. A slide position in the frame is normally biased to a first position by the contact means and is adapted when raised to a second position to apply pressure to a second point on the contact near its end to move the contact toward the slot. The slide may be of an insulating material and is raised by a suitable means such as a cam. The cam may be of a metallic material.

The foregoing and other objects, features of advantages of the invention will be apparent from the following more particular description of a preferred embodiment of the invention, is illustrated in the accompanying drawings.

Figure 1:
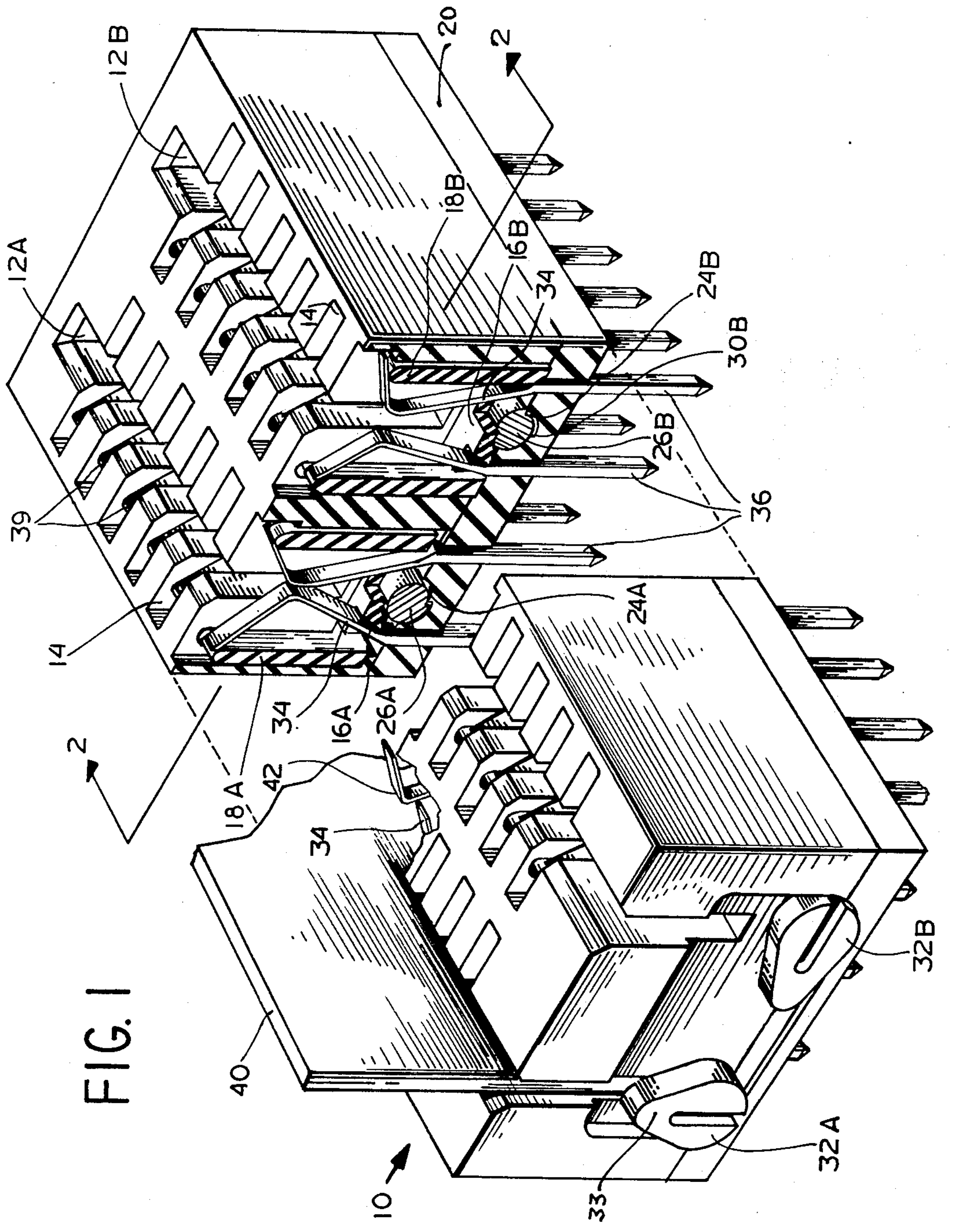
FIG. 1 is a cutaway perspective view of a preferred embodiment of the invention.

Referring now to the figures, it is seen that the receptacle for a preferred embodiment of the invention includes a frame 10 of hard insulating material with two elongated slots 12A and 12B formed therein. Each of the slots 12 extends to a depth slightly greater than half the thickness of frame 10 and each of he slots is intersected by a plurality of slots 14 which extends all the way through frame 10. For each of the slots 12, there is also a slide member 16 which extends the length of the slot along the bottom of frame 10. Each slide has a plurality of fingers 18 two of which extend into each slot 14 along the walls thereof. Frame 10 rests on and is secured, by cementing or other suitable means, to a base plate 20. The slide 16 and base plate 20 may also be constructed of a hard insulating material.

Figure 2:
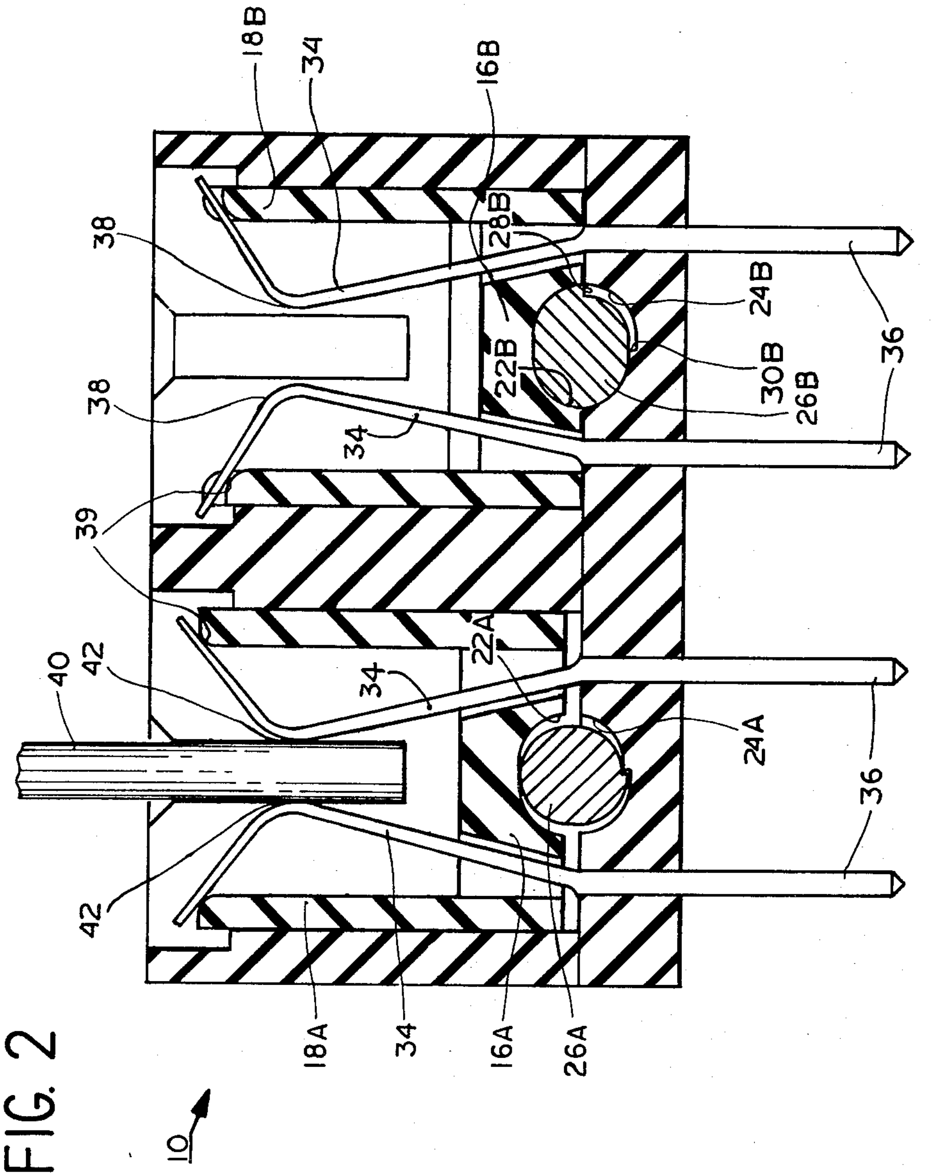
FIG. 2 is a sectional view along the line 2—2 of the receptacle shown in FIG. 1.

As may be best seen in FIG. 2, each slide 16 has a semi-circular ridge 22 formed on its underside near its center which is normally positioned opposite a mating ridge 24 in the upper surface of base plate 20 to form an eliptical opening. In each of these openings an eliptically shaped metal shaft 26 is rotationally mounted. When shaft 26 is in a position with its long axis horizontal, as shown for the B portion of the receptacle in the figures, slide 16 is in a lowered position flush against base 20. When shaft 26 is rotated 90° so that its long axis is vertical as shown for a A portion of receptacle in the figures, slide 16 is raised as shown. Rotation of each shaft 26 beyond the desired position is prevented by a stop mechanism which includes matching lips 28 and 30 on shaft 26 and base 20 respectively. Shafts 26 extend through the sides of the receptacle and terminate in slotted heads 32 (in FIG. 1 only the heads for the left side of the receptacle are shown). A screwdriver or other suitable tool may be inserted in the slot of a head 32 to move the attached shaft 26 between a closed position shown for the A portion of the receptacle and an open position shown for the B portion of the receptacle. When a head 32 is in the closed position shown for the A portion of the receptacle in FIG. 1, a projection 33 of head 32 extends over the end of slot 12, blocking the slot to prevent insertion and removal of a circuit board.

Each slot 14 also has two spring metal contact fingers 34 positioned therein. Each contact finger 34 projects through an opening in base plate 20 and terminates in a tail 36 which may be wire wrapped, dip soldered directly to a multi-layer board, or connected to in some other standard manner. As may be best seen in FIG. 2, each finger 34, as it emerges from base plate 20, is initially angled in toward slot 12 bending off at substantially a right angle away from the slot at a contact point 28 which is just outside the slot. The contact point may be coated with gold or some other precious metal to improve conductivity. The far end 39 of each contact finger 34 rests on the upper tip of a corresponding finger 18 of slide 16. Fingers 18 serve to prevent the contacts from returning to their normal unstressed condition and are thus held in the position shown for the B portion of the receptacle by the spring action of the contact fingers.

To assemble the receptacle shown in the figures, slides 16 are first positioned in frame 10 and contacts 34 are lowered in from the top. Base plate 20, with the cam shafts 26 position thereon, is then brought into position with the contact tails passed through openings therein. The final step in the assembly operation is to cement or otherwise secure the base plate to the frame.

In operation, a receptacle portion is normally in an open position as shown for the B portion in the figures. In this condition, a board 40 having contact pads 42 may be inserted or withdrawn from the receptacle with a zero force, and thus zero contact plating wear, during the board insertion and removal operations. As indicated previously, a minimal force may be desired during board insertion and withdrawal in order to permit a film-removing wiping action. Such a force may be obtained by normally positioning contact points 38 of fingers 34 a small distance into slot 12.

When a board 40 has been properly positioned in a slot 12, a screwdriver or other suitable tool is inserted in the slot of the corresponding head 32 and the head rotated 90° counterclockwise to move the head and the attached shaft 26 to the close position shown for the A portion of the receptacle. The rotating of shaft 26 to bring its long axis into a vertical position results in the raising of the corresponding slide 16. The resulting upward movement of fingers 18 applies a force to the tips 39 of contact fingers 34 moving these fingers by cantilever action toward the slot 12. The relative dimensions of the elements are such that the force exerted by the fingers 18 against the contacts 34 is greater than that required to make good physical and electrical contact with pads 42 of board 40. The excess pressure beyond that required to make good electrical contact is dissipated in bending the portion of the contact fingers beyond contact point 38 in an upward direction. A controlled pressure is thus applied to the board regardless of slight variations in board thickness or warpage.

Since there is an insulating slide 16 between cam 26 and contacts 34, the cam may be made of a high torque bearing metal. The shaft may thus be substantially smaller in cross-section than the non-conducting plastic shafts utilized in some prior art receptacles which have the cam shaft bearing directly against the contact fingers. This effectively increases the range of dimensions which may be used for the elements of the receptacle, permitting far smaller receptacles to be constructed. It should also be noted that the receptacle provides a short electrical path between the point at which each contact 34 emerges from plate 20 and its contact point 38, and that the force required to move the contacts is minimized by applying the force to a point 39 at the far tip of each contact.

While in the preferred embodiment of the invention shown in the figures a receptacle having two double sided positions has been shown, it is apparent that a receptacle having positions for a greater or lesser number of boards may be provided utilizing the teaching of this invention. Similarly, these teachings may be easily applied for use with single sided as well as double sided boards merely by eliminating a finger 18 and contact 34 from each slot 14. The receptacle may be modified for top insertion applications by merely closing side-wall opening for each slot 12. Other modifications in details would suggest themselves to those skilled in the art. Thus, while the invention has been particularly shown and described with reference to a preferred embodiment thereof, it will be understood by those skilled in the art that the foregoing and other changes in form and details may be made therein without departing from the spirit and scope of the invention.

What is claimed is:

1. A receptacle for a flat circuit bearing element having contact points along at least one edge thereof comprising:

a frame assembly having a slot therein which is adapted to receive the edge of said element having said contact points;

at least one contact mounted in said frame, said contact being angled toward said slot to a first point midway along its length and away from said slot for the remainder of its length, said first point being normally positioned relative to said slot so as to be adapted to apply a controlled pressure to an element position in the slot;

a slide positioned in said frame and normally biased to a first position, a cam shaft positioned between said slide and frame assembly; and means for moving said slide to a second position in which it is applying pressure to a second point near the end of said contact to move said contact toward said slot, whereby the pressure applied by said first point to said element is increased.

2. A receptacle of the type described in 1 wherein said cam shaft is of a metallic material and said slide and frame assembly are of an insulating material.

3. A receptacle for a flat circuit bearing element having contact points along a pair of opposite edges thereof comprising:

a frame assembly having a slot therein which is adapted to receive said edges of said element having said contact points;

at least one pair of oppositely positioned contacts mounted in said frame, each of said contacts being angled toward said slot to a first point midway along its length and away from said slot for the remainder of its length, said first point being normally positioned relative to said slot so as to be adapted to apply a controlled pressure to said element in said slot a slide positioned in said frame assembly and normally biased to a first position, said slide including a finger for each contact; and means between said slide and said frame assembly for moving said slide including said fingers to a second position in which each of said fingers is applying pressure to a second point near the end of each of said contacts to move said each contact toward said slot, whereby the pressure applied by said first point to said element is increased.

4. A receptacle of the type described in claim 3 wherein said slide moving means is of metallic material and said frame assembly is of an insulating material.

5. A receptacle of the type described in claim 4 wherein said slide moving means is also disposed between said contacts.

6. A receptacle of the type described in claim 5 wherein said slide moving means is a cam shaft.

* * * * *